US012649376B2

(12) United States Patent
Yamaguchi et al.

(10) Patent No.: US 12,649,376 B2
(45) Date of Patent: Jun. 9, 2026

(54) CONNECTOR INCLUDING HEAT STORAGE MEMBER THAT IS ELASTICALLY DEFORMABLE IN ACCORDANCE WITH SHAPE OF ACCOMMODATION SPACE

(71) Applicant: YAZAKI CORPORATION, Tokyo (JP)

(72) Inventors: Yasuhiro Yamaguchi, Kakegawa (JP); Hideki Mizuno, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 330 days.

(21) Appl. No.: 18/414,461

(22) Filed: Jan. 17, 2024

(65) Prior Publication Data

US 2024/0253487 A1 Aug. 1, 2024

(30) Foreign Application Priority Data

Jan. 30, 2023 (JP) ................................. 2023-011946

(51) Int. Cl.
*H01R 13/52* (2006.01)
*B60L 53/16* (2019.01)
(Continued)

(52) U.S. Cl.
CPC .......... *B60L 53/16* (2019.02); *H01R 13/5219* (2013.01); *H05K 7/20454* (2013.01); *H01R 2103/00* (2013.01); *H01R 2201/26* (2013.01)

(58) Field of Classification Search
CPC . B60L 53/16; H01R 13/5219; H01R 2103/00; H01R 2201/26; H01R 4/72;
(Continued)

(56) References Cited

U.S. PATENT DOCUMENTS 10,833,458 B2 * 11/2020 Sarraf ................ H01R 13/6683
2012/0231644 A1 * 9/2012 Kinoshita .......... H01R 13/5227
439/205

(Continued)

FOREIGN PATENT DOCUMENTS

JP 2018-133278 A 8/2018
JP 2019-192482 A 10/2019
JP 2023-3377 A 1/2023

*Primary Examiner* — Abdullah A Riyami
*Assistant Examiner* — Nelson R. Burgos-Guntin
(74) *Attorney, Agent, or Firm* — KENEALY VAIDYA LLP

(57) ABSTRACT

There is provided a connector including: an electric wire; a terminal connected to the electric wire; a housing having an accommodation space inside the housing, the accommodation space accommodating a connection portion between the electric wire and the terminal; a seal member configured to seal an opening portion of the accommodation space to isolate the connection portion accommodated in the accommodation space from outside; and a heat storage member disposed in the accommodation space to surround the connection portion. The heat storage member is deformable to elastically expand and contract in accordance with a shape of the accommodation space. A first part of the heat storage member is in contact with an inner surface of the housing defining the accommodation space, and a second part of the heat storage member is in contact with an outer surface of the connection portion.

4 Claims, 7 Drawing Sheets

(51) Int. Cl.
    *H05K 7/20*         (2006.01)
    *H01R 103/00*      (2006.01)

(58) Field of Classification Search
    CPC .............. H01R 13/533; H01R 13/5202; H05K
              7/20454; H05K 7/2039; H05K 7/20445
    See application file for complete search history.

(56)            References Cited

U.S. PATENT DOCUMENTS

| | | | | |
|---|---|---|---|---|
| 2014/0113479 A1* | 4/2014 | Yoon | .................. | H01R 13/5205 |
| | | | | 439/372 |
| 2017/0133804 A1* | 5/2017 | Macauda | ................ | H01R 13/73 |
| 2019/0131740 A1* | 5/2019 | Funk | ................... | H01R 13/533 |
| 2019/0334293 A1 | 10/2019 | Iwami et al. | | |
| 2020/0313344 A1* | 10/2020 | Araki | ................. | H05K 7/20127 |
| 2021/0265764 A1* | 8/2021 | Hachadorian | ...... | H01R 13/5213 |
| 2021/0333156 A1* | 10/2021 | Daily | ....................... | G01K 1/14 |
| 2021/0347270 A1* | 11/2021 | Cole | ....................... | B60L 53/16 |
| 2021/0394626 A1* | 12/2021 | Genece | ................... | B60L 53/16 |
| 2022/0332198 A1* | 10/2022 | Rhodes | .................. | B60L 53/18 |
| 2022/0416469 A1* | 12/2022 | Uki | ....................... | B60L 53/302 |
| 2022/0416471 A1* | 12/2022 | Yamaguchi | .......... | H01R 13/512 |

* cited by examiner

UPPER

LEFT          REAR

FRONT          RIGHT

LOWER

CONNECTOR INCLUDING HEAT STORAGE MEMBER THAT IS ELASTICALLY DEFORMABLE IN ACCORDANCE WITH SHAPE OF ACCOMMODATION SPACE

CROSS-REFERENCE TO RELATED APPLICATIONS

This application is based on and claims priority under 35 USC 119 from Japanese Patent Application No. 2023-011946 filed on Jan. 30, 2023, the contents of which are incorporated herein by reference.

TECHNICAL FIELD

The present disclosure relates to a connector including an electric wire, a terminal, a housing that accommodates a connection portion between the electric wire and the terminal, a seal member that seals an opening portion of an accommodation space, and a heat storage member disposed in the accommodation space.

BACKGROUND ART

In the related art, in order to supply (charge) electric power from the outside of a vehicle to a battery mounted on a vehicle such as an electric automatic vehicle or a plug-in hybrid automatic vehicle, a charging connector installed in the vehicle has been proposed (for example, see JP2019-192482A and JP2018-133278A). This type of connector is generally called a charging inlet.

The above-described types of connectors (charging inlets) are generally required to have structures and characteristics defined by various standards. For example, when the connector described above is actually used, a temperature of a terminal (so-called operating temperature) rises due to Joule heat generated in the terminal at the time of energization.

In view of quality retention, safety, and the like of the connector, an upper limit value and the like of the operating temperature of the terminal are determined by a predetermined standard.

However, in the connector described above of the related art, the connection portion between the terminal and the electric wire is sealed by a packing or the like and isolated from the outside from a viewpoint of waterproofing or the like although the connection portion is a portion where an amount of heat generation is large due to a magnitude of a contact resistance. Further, the air in a space isolated in this manner also acts as a heat insulating material.

Therefore, it is considered that it is very difficult to radiate heat to the outside from the connection portion between the terminal and the electric wire. In addition, for example, in a case of performing rapid charging of the battery or the like, since a large current passes through the connector in a short time, a degree of temperature rise of the terminal (particularly, the connection portion described above) per unit time is higher than that in a case of performing normal charging. For this reason, in the connector of the related art, there is a possibility that it is difficult to keep the operating temperature of the terminal within a range defined by the standard only by natural heat radiation.

SUMMARY OF INVENTION

The present disclosure provides a connector that can prevent an excessive increase in operating temperature of a terminal while avoiding an increase in size of the connector.

The connector according to the present disclosure has the following features.

According to an illustrative aspect of the present disclosure, a connector includes: an electric wire; a terminal connected to the electric wire; a housing having an accommodation space inside the housing, the accommodation space accommodating a connection portion between the electric wire and the terminal; a seal member configured to seal an opening portion of the accommodation space to isolate the connection portion accommodated in the accommodation space from outside; and a heat storage member disposed in the accommodation space to surround the connection portion. The heat storage member is deformable to elastically expand and contract in accordance with a shape of the accommodation space. A first part of the heat storage member is in contact with an inner surface of the housing defining the accommodation space, and a second part of the heat storage member is in contact with an outer surface of the connection portion.

The present disclosure has been briefly described above. Details of the present disclosure can be clarified by reading modes for carrying out the disclosure described below with reference to the accompanying drawings.

DESCRIPTION OF EMBODIMENTS

Embodiment

Hereinafter, a connector 1 according to an embodiment of the present disclosure will be described with reference to the drawings. The connector 1 is a connector that is installed in a vehicle such as a plug-in hybrid automatic vehicle or an electric automatic vehicle, and is connected to an electric wire extending from a battery mounted in the vehicle. The connector 1 is also called a charging inlet. By fitting a mating connector (so-called charging gun) into a fitting recessed portion 63 (see FIG. 1 and the like) of the connector 1, electric power is supplied to the battery from the outside of the vehicle, and the battery is charged.

Hereinafter, for convenience of description, "front", "rear", "left", "right", "upper", and "lower" are defined as illustrated in FIGS. 1 to 7. A "front-rear direction", a "left-right direction", and an "upper-lower direction" are orthogonal to one another. The front-rear direction corresponds to a fitting direction of the connector 1 and the mating connector (not illustrated), and a front side in the fitting direction (a side closer to the mating connector) as viewed from the connector 1 is referred to as a "front side", and a release side in the fitting direction (a side away from the mating connector) as viewed from the connector 1 is referred to as a "rear side".

Figure 1:
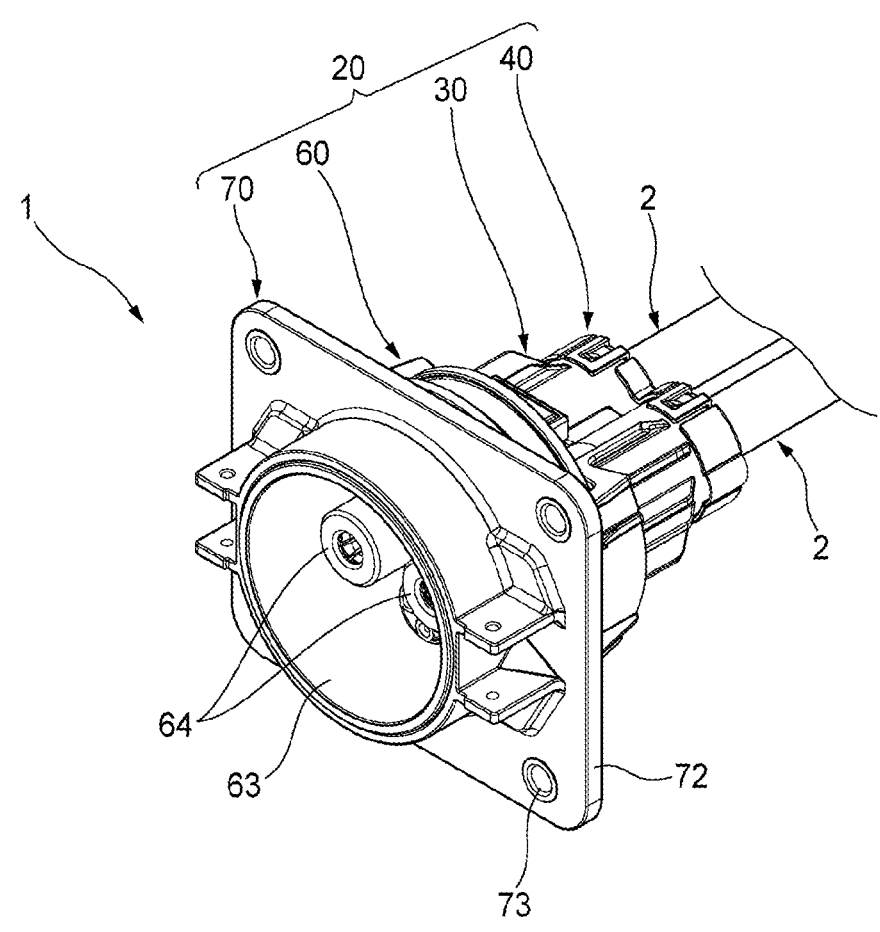
FIG. 1 is a perspective view illustrating a state in which a connector according to an embodiment of the present disclosure is connected to electric wires.
Figure 1:
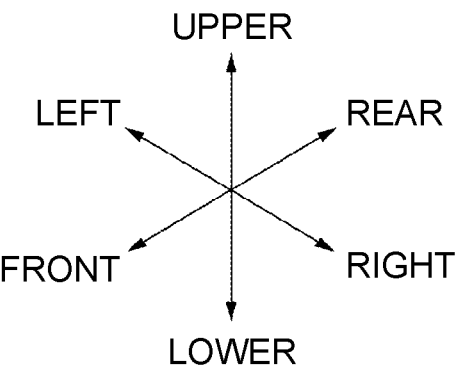
Figure 2:
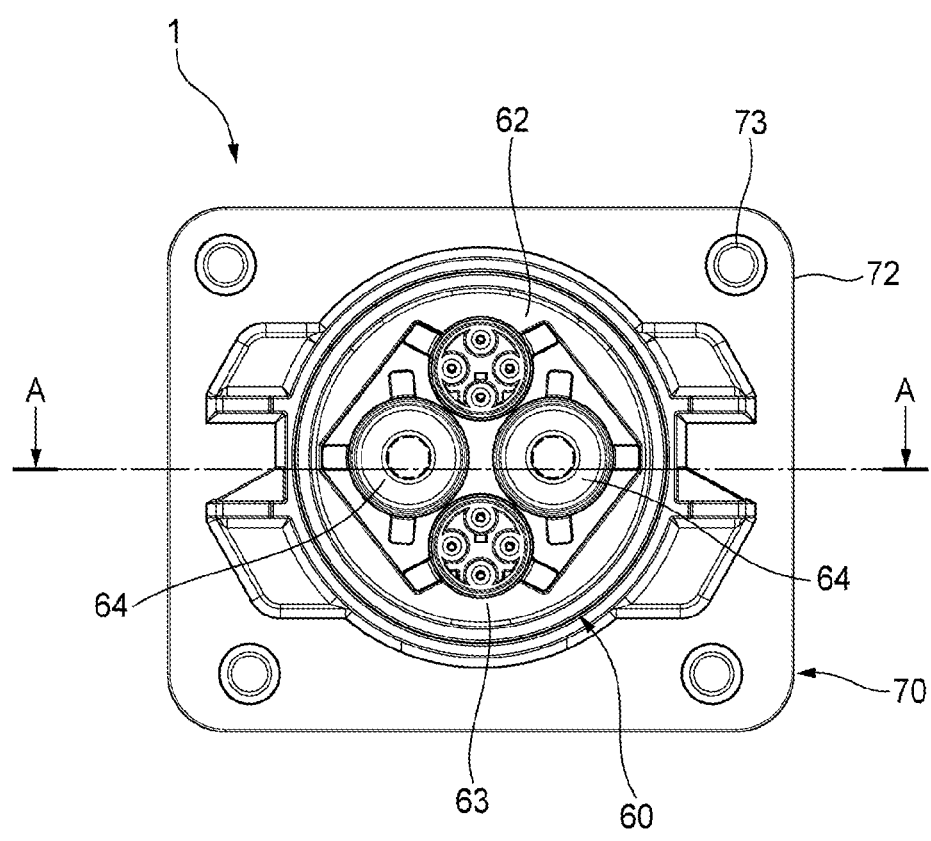
FIG. 2 is a front view of the connector illustrated in FIG. 1.
Figure 2:
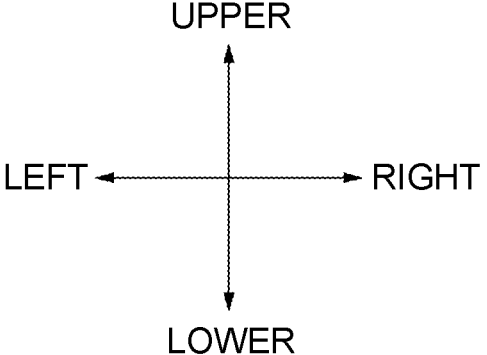
Figure 7:
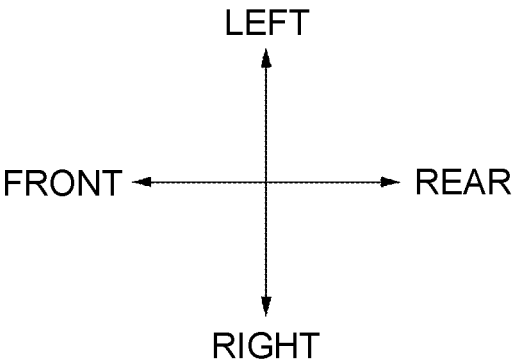
FIG. 7 is a cross-sectional view taken along a line A-A in FIG. 2.

As illustrated in FIGS. 1 and 7 and the like, the connector 1 includes a pair of terminals 10 and a housing 20 in which the pair of terminals 10 are accommodated. One end portions of the pair of electric wires 2 are respectively connected to the pair of terminals 10. The other end portions of the pair of electric wires 2 are connected to a battery (not illustrated). Each of the electric wires 2 includes a conductor core wire 2a and a coating 2b made of an insulating resin and covering the conductor core wire 2a (see FIG. 7). Hereinafter, each component constituting the connector 1 will be described in order.

Figure 4:
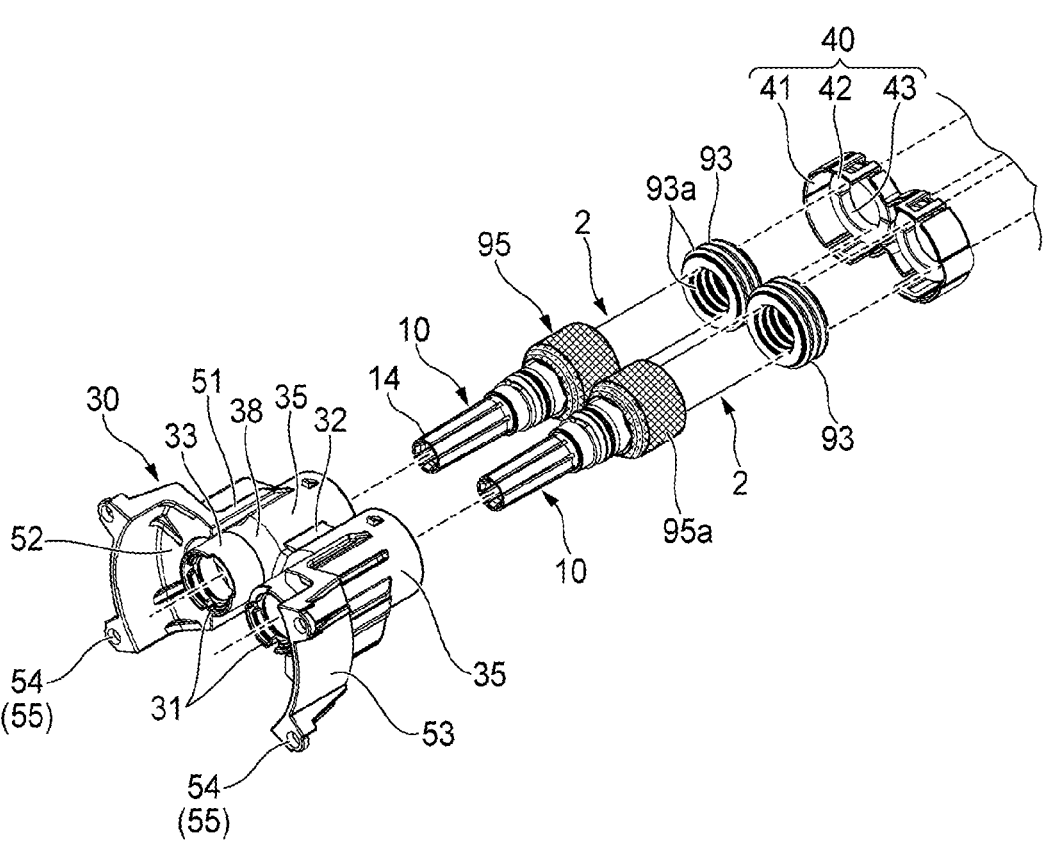
FIG. 4 is a perspective view illustrating a state in which another part of the plurality of components constituting the connector illustrated in FIG. 1 is disassembled.
Figure 4:
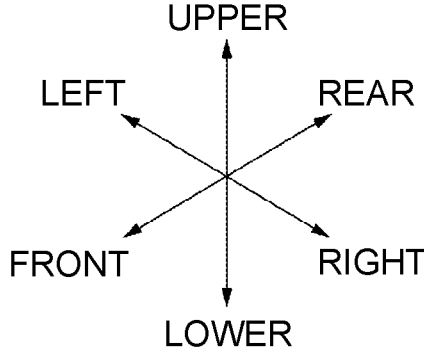
Figure 5:
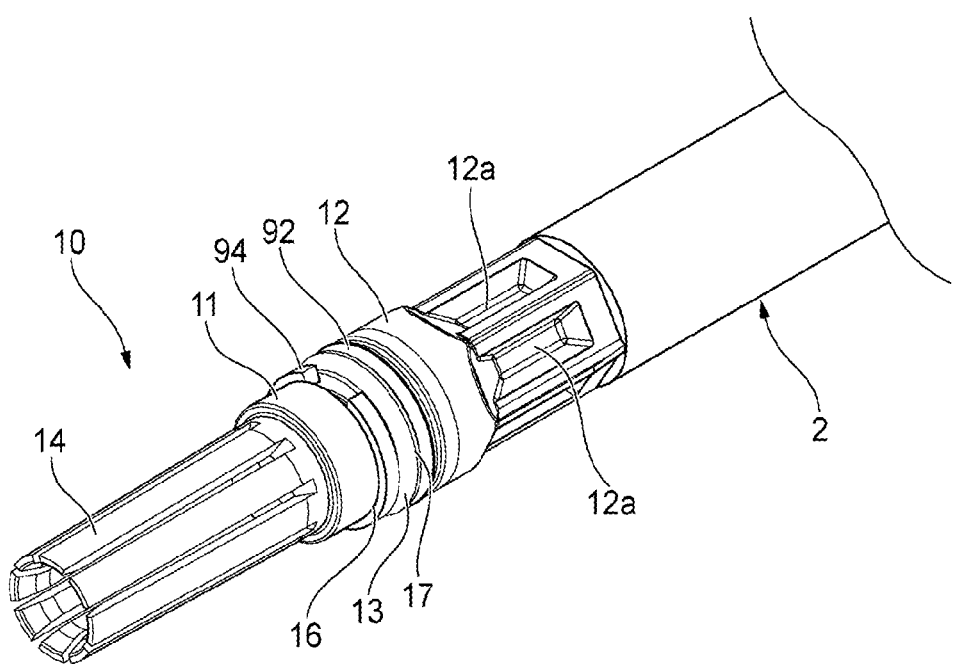
FIG. 5 is a perspective view illustrating a state in which a terminal constituting the connector illustrated in FIG. 1 is connected to the electric wire.
Figure 5:
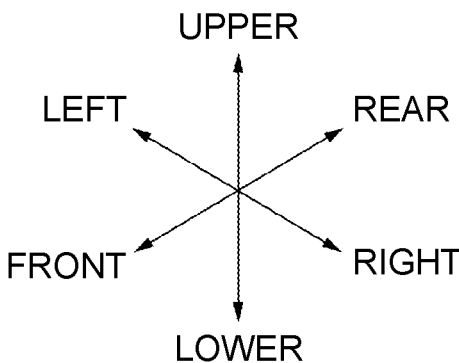

First, the pair of terminals 10 will be described. In the present embodiment, the pair of terminals 10 have the same shape. Each terminal 10 is made of metal and has a stepped columnar portion including a small diameter portion 11 and a large diameter portion 12 located behind the small diameter portion 11 as illustrated in FIGS. 4 and 5. An annular step portion 13 is formed at a boundary portion between the small diameter portion 11 and the large diameter portion 12. The step portion 13 is locked to a locking protrusion 37 (see FIG. 7) of a base holder 30 to be described later.

The small diameter portion 11 is integrally provided with a cylindrical female terminal portion 14 protruding forward from a front end surface thereof. Of the pair of terminals 10, the female terminal portion 14 of one terminal 10 functions as an anode side terminal, and the female terminal portion 14 of the other terminal 10 functions as a cathode side terminal. When the connector 1 and the mating connector are fitted to each other, the female terminal portion 14 of one terminal 10 and the female terminal portion 14 of the other terminal 10 are respectively connected to a male terminal portion on an anode side and a male terminal portion on a cathode side of the mating connector.

A recessed portion 15 recessed forward is formed in a rear end surface of the large diameter portion 12 (see FIG. 7). The conductor core wire 2a exposed at one end portion of the electric wire 2 is inserted into the recessed portion 15 and is fixed by caulking. In the present embodiment, due to the caulking, concave caulking marks 12a are formed at a plurality of (six) positions in a peripheral direction on an outer peripheral surface of the large diameter portion 12 (see FIGS. 5 and 7). Thus, the terminal 10 and one end portion of the electric wire 2 are electrically connected. The large diameter portion 12 of the terminal 10 and the conductor core wire 2a of the electric wire 2 constitute a "connection portion" between the electric wire 2 and the terminal 10.

As illustrated in FIG. 5, an annular groove 16 is formed on an outer peripheral surface of the small diameter portion 11 in a vicinity of the step portion 13, and an annular groove 17 is formed on an outer peripheral surface of the large diameter portion 12 in a vicinity of the step portion 13. A C-ring 94 (see FIGS. 5 and 7) to be described later is mounted to the annular groove 16, and an O-ring 92 (see FIGS. 5 and 7) to be described later is mounted to the annular groove 17. The pair of terminals 10 has been described above.

Next, the housing 20 will be described. As illustrated in FIGS. 1 and 7, the housing 20 includes the base holder 30, a rear holder 40, an inner housing body 60, and an outer housing body 70. The base holder 30, the rear holder 40, the inner housing body 60, and the outer housing body 70 are framework components of the housing 20, and constitute a part of an outer surface of the housing 20. Hereinafter, each component constituting the housing 20 will be described in order. The "framework component" of the housing 20 refers to a component having sufficient hardness and strength to maintain a shape of the housing 20 itself so as to hold a position of the terminal 10 against an external force applied to the terminal 10 when the terminal 10 and the mating terminal (not illustrated) are fitted together, for example. In other words, it represents a component made of a material that is not softened or fragile to such an extent that it is difficult to maintain its shape due to an increase in the operating temperature of the terminal 10.

First, the base holder 30 will be described. The base holder 30 functions to hold the pair of terminals 10 in a state of being spaced apart from each other in the left-right direction and insulated from each other. The base holder 30 is a resin molded product and, as illustrated in FIG. 4, integrally includes a pair of terminal holding portions 31 arranged in the left-right direction and a coupling portion 32 coupling the pair of terminal holding portions 31 in the left-right direction.

As illustrated in FIG. 4, each terminal holding portion 31 has a stepped cylindrical shape extending in the front-rear direction, which includes a small diameter portion 33 and a large diameter portion 35 located behind the small diameter portion 33. The coupling portion 32 couples the large diameter portions 35 of the pair of terminal holding portions 31. The pair of terminals 10 are inserted into internal spaces 31a (see FIG. 7) of the pair of terminal holding portions 31 from a rear side.

An annular step portion 38 (see FIGS. 4 and 7) is formed at a boundary portion between the small diameter portion 33 and the large diameter portion 35. The annular locking protrusion 37 protruding radially inward of the small diameter portion 33 is formed on an inner wall surface of a front end portion of the small diameter portion 33 so as to correspond to the step portion 13 of the terminal 10 (see FIG. 7).

Figure 3:
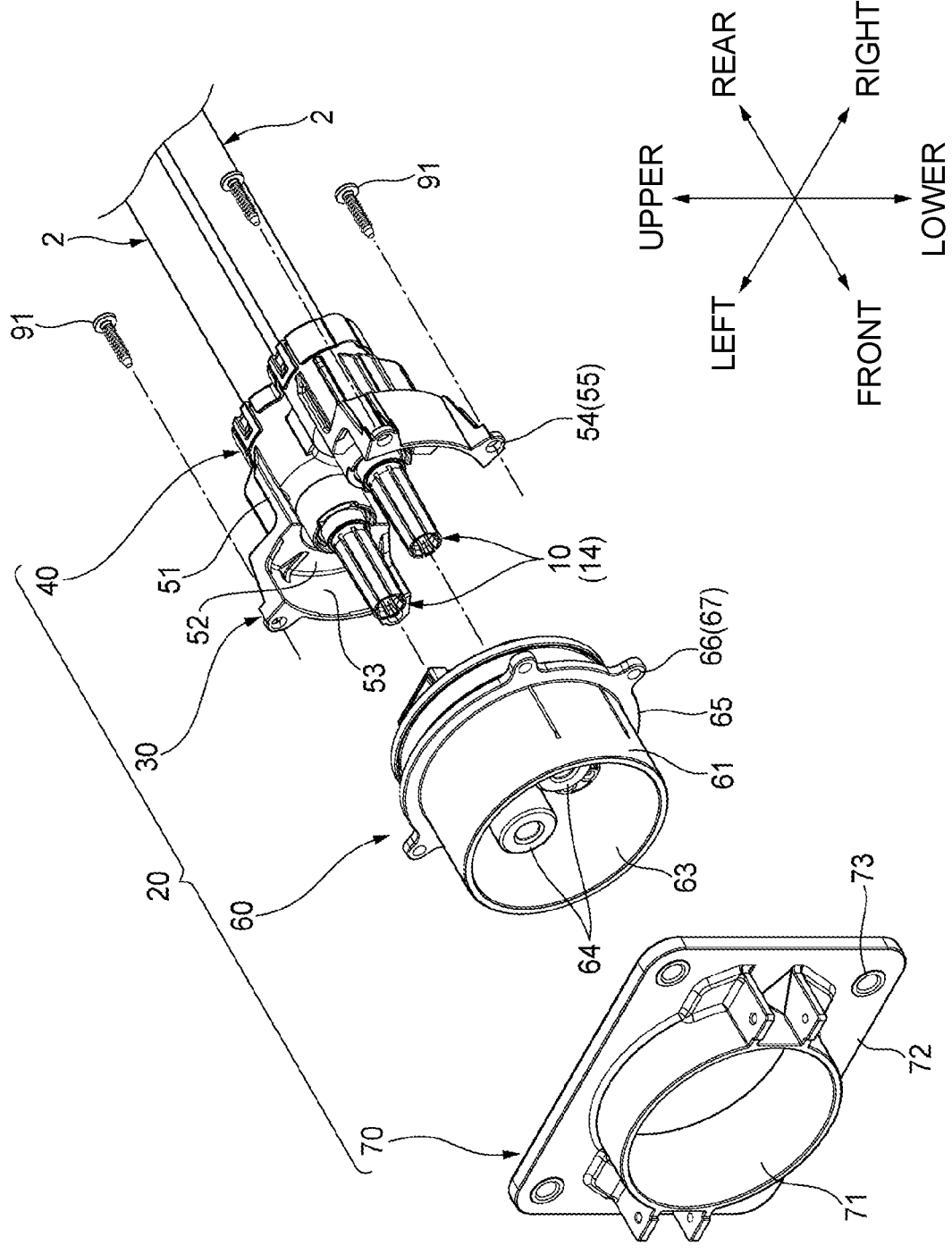
FIG. 3 is a perspective view illustrating a state in which a part of a plurality of components constituting the connector illustrated in FIG. 1 is disassembled.

As illustrated in FIGS. 3, 4, and 7, the base holder 30 further includes a pair of protruding portions 51 extending forward in the front-rear direction from the pair of large diameter portions 35. A pair of extending portions 52 extending outward in the left-right direction from both side portions in the left-right direction of front end portions of the pair of protruding portions 51 and a pair of side wall portions 53 extending forward from extending end portions of the extending portions 52 are integrally provided at the front end portions thereof. The pair of side wall portions 53 have a shape corresponding to a part in a peripheral direction of an outer peripheral shape (cylindrical shape) of a tubular portion 61 (see also FIG. 3) of the inner housing body 60 to be described later as viewed in the front-rear direction, and are mountable to the tubular portion 61 so as to cover an outer peripheral surface of a rear end portion of the tubular portion 61.

As illustrated in FIGS. 3 and 4, bolt insertion portions 54 are provided at a plurality of positions (four positions in the present embodiment) on outer peripheral surfaces (outer side surfaces in the left-right direction) of the pair of side wall portions 53. A bolt insertion hole 55 penetrating in the front-rear direction is formed in each bolt insertion portion 54. A bolt 91 (see FIG. 3) for assembling the housing 20 is inserted into each bolt insertion hole 55.

Next, the rear holder 40 will be described. The rear holder 40 is assembled to the base holder 30 from the rear side and has a function of holding the pair of electric wires 2 extending rearward from the pair of terminals 10 in a state of being spaced apart from each other in the left-right direction. The rear holder 40 is a resin molded product and, as illustrated in FIG. 4, integrally includes a tubular portion 41 extending in the front-rear direction and a rear wall portion 42 closing a rear opening of the tubular portion 41.

The tubular portion 41 has an outer peripheral shape corresponding to an outer peripheral shape formed by the pair of large diameter portions 35 and the coupling portion 32 of the base holder 30, and is mountable to the rear end portion of the base holder 30 so as to cover the outer peripheral surfaces of the rear end portions of the pair of large diameter portions 35 and the coupling portion 32. A pair of electric wire insertion holes 43 that are aligned in the left-right direction and penetrate in the front-rear direction are formed in the rear wall portion 42 so as to correspond to the pair of large diameter portions 35. The pair of electric wires 2 are inserted into the pair of electric wire insertion holes 43 (see FIG. 7).

Next, the inner housing body 60 will be described. The inner housing body 60 is assembled to the pair of side wall portions 53 of the base holder 30 from the front side thereof, and functions as the fitting recessed portion 63 (see also FIG. 1) of the connector 1. The inner housing body 60 is a resin molded product and integrally includes the tubular portion 61 extending in the front-rear direction and a rear wall portion 62 closing a rear opening of the tubular portion 61. The tubular portion 61 and the rear wall portion 62 define the fitting recessed portion 63 that is open forward and recessed rearward.

The rear wall portion 62 is provided with a pair of cylindrical female terminal accommodating portions 64 corresponding to the female terminal portions 14 of the pair of terminals 10 so as to protrude forward (see FIGS. 3 and 7). Each female terminal accommodating portion 64 is located in the fitting recessed portion 63 and has an internal space penetrating in the front-rear direction.

As illustrated in FIG. 3, an annular flange portion 65 protruding radially outward of the tubular portion 61 is provided on an outer peripheral surface of the tubular portion 61 at a position behind a center in the front-rear direction. The flange portion 65 is provided with bolt insertion portions 66 at a plurality of positions (four positions in the present embodiment) in the peripheral direction corresponding to the plurality of bolt insertion portions 54 of the base holder 30. A bolt insertion hole 67 penetrating in the front-rear direction is formed in each bolt insertion portion 66. The bolt 91 (see FIG. 3) for assembling the housing 20 is inserted into each bolt insertion hole 67.

Next, the outer housing body 70 will be described. The outer housing body 70 is assembled to the tubular portion 61 of the inner housing body 60 from the front side thereof and has a function of fixing the entire housing 20 to an object portion to be attached (not illustrated) of the connector 1 provided in the vehicle. The outer housing body 70 is a resin molded product and includes a tubular portion 71 extending in the front-rear direction. The tubular portion 71 is mountable to the tubular portion 61 from the front side thereof so as to cover the outer peripheral surface of the tubular portion 61 of the inner housing body 60 (see FIG. 7).

As illustrated in FIG. 3, an annular flange portion 72 protruding radially outward of the tubular portion 71 is provided on the outer peripheral surface of the tubular portion 71 at a position behind the center in the front-rear direction. The flange portion 72 has a rectangular outer peripheral shape as viewed in the front-rear direction. Bolt insertion holes 73 are formed at four corner portions of the flange portion 72 so as to penetrate the flange portion 72 in the front-rear direction. A bolt (not illustrated) for fixing the connector 1 to the object portion to be attached of the connector 1 is inserted into each bolt insertion hole 73.

The components constituting the housing 20 have been described above.

Next, an assembling procedure of the connector 1 will be described. First, the pair of terminals 10 to which the one end portions of the pair of electric wires 2 are connected are inserted into the base holder 30. For this reason, in preparation, as illustrated in FIGS. 4 and 7, the pair of electric wire insertion holes 43 of the rear holder 40 are inserted into the coatings 2b of the pair of electric wires 2 connected to the pair of terminals 10 from the front side, and then cylindrical rubber packings 93 extending in the front-rear direction are inserted into the coatings 2b of the pair of electric wires from the front side so as to be adjacent to a front side of the rear wall portion 42 of the rear holder 40, respectively. Further, rubber O-rings 92 (see FIGS. 5 and 7) are mounted to the annular grooves 17 of the pair of terminals 10.

Figure 6:
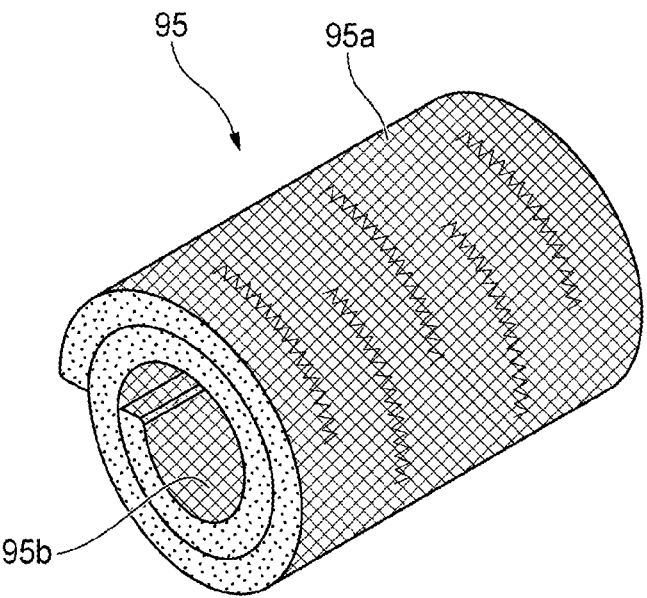
FIG. 6 is a perspective view illustrating a state in which a sheet-shaped heat storage member is rolled into a cylindrical shape.
Figure 6:
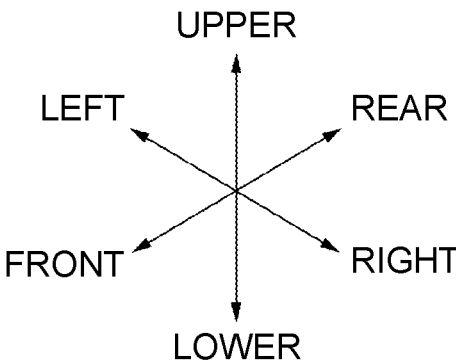

Next, a cylindrical heat storage member 95 extending in the front-rear direction is mounted on the large diameter portion 12 so as to surround an outer periphery of the large diameter portion 12 of each terminal 10 (that is, so as to surround the connection portion between the electric wire 2 and the terminal 10) (see FIG. 4). The heat storage member 95 is a member having a function of absorbing heat generated at the connection portion between the electric wire 2 and the terminal 10 and radiating the heat to the outside (this will be described later). The cylindrical heat storage member 95 can be mounted on the large diameter portion 12 by moving the cylindrical heat storage member 95 in parallel in the front-rear direction to cover the outer periphery of the large diameter portion 12, or by winding the rectangular sheet-shaped (plate-shaped) heat storage member 95 as illustrated in FIG. 6 around the outer peripheral surface of the large diameter portion 12 of the terminal 10. The heat storage member 95 mounted to the large diameter portion 12 is preferably fixed to the outer peripheral surface of the large diameter portion 12 by a method such as laser bonding.

The heat storage member 95 has a three-dimensional structure made of a metal wire material capable of sensible heat storage, and is configured to be deformable so as to elastically expand and contract in accordance with a shape of a space in which the heat storage member 95 is accommodated. Examples of the heat storage member 95 having such a three-dimensional structure include metal wire wool (for example, copper wire wool) and steel wool.

Next, the pair of terminals 10 are inserted into the internal spaces 31a (see FIG. 7) of the pair of terminal holding portions 31 of the base holder 30 from the rear side thereof. This insertion is continued until the small diameter portions 11 and the female terminal portions 14 of the pair of terminals 10 protrude forward from front ends of the pair of terminal holding portions 31 and the step portions 13 of the pair of terminals 10 are locked to the locking protrusions 37 of the pair of terminal holding portions 31. In a state where the insertion is completed (that is, in a state where the insertion of the pair of terminals 10 into the base holder 30 is completed), as illustrated in FIG. 7, the O-rings 92 mounted on the terminals 10 are in press contact with the inner wall surfaces of the small diameter portions 33 of the terminal holding portions 31. Further, each heat storage member 95 is disposed in a gap between the outer peripheral surface of the large diameter portion 12 of the terminal 10 and an inner peripheral surface of the large diameter portion 35 of the terminal holding portion 31 (that is, in the internal space 31a) in a state of elastically expanding and contracting and being deformed in accordance with a shape of the internal space 31a. More specifically, as illustrated in FIG. 7, an outer peripheral surface 95a of the heat storage member 95 is deformed so as to be in press contact with the inner peripheral surface of the cylindrical large diameter portion 35 of the base holder 30 and an inner peripheral surface of the tapered step portion 38 (that is, the inner surface of the housing 20), and an inner peripheral surface 95b of the heat storage member 95 is deformed so as to be in press contact with the outer peripheral surface of the cylindrical large diameter portion 12 of the terminal 10 and inner wall surfaces of the concave caulking marks 12a (that is, an outer surface of the connection portion between the electric wire 2 and the terminal 10).

Next, the metal C-ring 94 is mounted in the annular groove 16 of the small diameter portion 11 of the terminal 10 protruding forward from the front end of each terminal holding portion 31 of the base holder 30 (see FIGS. 5 and 7). As a result, the C-ring 94 is engaged with the locking protrusion 37 of the terminal holding portion 31 to prevent the terminal 10 from coming off rearward from the base holder 30.

Next, the rear holder 40 is mounted on the base holder 30. Therefore, the tubular portion 41 of the rear holder 40 is mounted to the rear end portion of the base holder 30 by pressing the rear holder 40 forward and moving the rear holder 40 and the pair of packings 93 located in front of the rear holder 40 forward with respect to the pair of electric wires 2 (see FIGS. 3 and 7).

In a state where the mounting of the rear holder 40 to the base holder 30 is completed, each packing 93 is pressed and held between the inner wall surface of the large diameter portion 35 of the terminal holding portion 31 and the outer peripheral surface of the electric wire 2 (the coating 2b). Specifically, a plurality of ribs 93a of each packing 93 are pressed against the inner wall surface of the large diameter portion 35 and the outer peripheral surface of the electric wire 2 (the coating 2b). As a result, the internal spaces 31a of the pair of terminal holding portions 31 are isolated from the outside by water-stopping functions of the pair of O-rings 92 and the pair of packings 93. As a result, intrusion of water from the outside to the internal spaces 31a of the pair of terminal holding portions 31 (that is, the connection portions between the electric wires 2 and the terminals 10) is prevented.

Further, the pair of terminals 10 are held by the base holder 30 so as to be spaced apart from each other in the left-right direction and insulated from each other, and the pair of electric wires 2 extending rearward from the pair of terminals 10 are held by the rear holder 40 so as to be spaced apart from each other in the left-right direction.

When the mounting of the rear holder 40 to the base holder 30 is completed, the inner housing body 60 is then mounted to the base holder 30 (see FIGS. 3 and 7). Therefore, the inner housing body 60 is mounted to the base holder 30 from the front side such that the pair of side wall portions 53 of the base holder 30 cover a part of the outer peripheral surface of the tubular portion 61 of the inner housing body 60 and the female terminal portions 14 of the pair of terminals 10 are inserted into the pair of female terminal accommodating portions 64 of the inner housing body 60 (see FIG. 7). In a state where the mounting is completed, as illustrated in FIG. 7, front end surfaces of the pair of side wall portions 53 of the base holder 30 abuts against a rear end surface of the flange portion 65 of the inner housing body 60.

When the mounting of the inner housing body 60 to the base holder 30 is completed, the outer housing body 70 is then mounted to the inner housing body 60 (see FIGS. 3 and 7). Therefore, the outer housing body 70 is mounted on the inner housing body 60 from the front side such that the tubular portion 71 of the outer housing body 70 covers the outer peripheral surface of the tubular portion 61 of the inner housing body 60 (see FIG. 7). In a state where the mounting is completed, as illustrated in FIG. 7, a rear end surface of the tubular portion 71 of the outer housing body 70 abuts against a front end surface of the flange portion 65 of the inner housing body 60.

When the mounting of the outer housing body 70 to the inner housing body 60 is completed, next, as illustrated in FIG. 3, the plurality of (four in the present embodiment) bolts 91 are inserted into the plurality of bolt insertion holes 55 of the base holder 30 and the plurality of bolt insertion holes 67 of the inner housing body 60 from the rear side and are fastened to a plurality of fastening portions (not illustrated) provided in the outer housing body 70. Accordingly, the base holder 30, the rear holder 40, the inner housing body 60, and the outer housing body 70, which constitute framework components of the housing 20, are integrated by fastening the base holder 30 and the inner housing body 60 together with the outer housing body 70. Therefore, the assembly of the connector 1 is completed, and the connector 1 illustrated in FIG. 1 is obtained.

The assembled connector 1 is fastened and fixed to the object portion to be mounted (not illustrated) of the connector 1 provided in the vehicle using the plurality of bolts (not illustrated) inserted into the plurality of bolt insertion holes 73 of the outer housing body 70.

When the battery (not illustrated) mounted on a vehicle is charged, the mating connector (so-called charging gun) is fitted into the fitting recessed portion 63 of the connector 1 fixed to the object portion to be attached of the vehicle. Accordingly, electric power is supplied to the battery from the outside of the vehicle via the mating connector, the connector 1, and the pair of electric wires 2 in this order, and the battery is charged.

Next, an operation of providing the heat storage member 95 in the connector 1 will be described. As described above, when the battery is charged using the connector 1, the temperature of the pair of terminals 10 in the connector 1 rises due to Joule heat caused by energization. In particular, although the connection portion between the electric wire 2 and the terminal 10 is a portion where an amount of heat generation is large due to a magnitude of a contact resistance, it is difficult to radiate heat to the outside because the connection portion is sealed by the O-ring 92 and the packing 93 and isolated from the outside in the internal space 31a of the terminal holding portion 31, and the air in the isolated internal space 31a acts as a heat insulating material. Therefore, in order to make the temperature rise of the terminal 10 gentle, it is important to efficiently absorb heat generated at the connection portion between the electric wire 2 and the terminal 10.

In this regard, in the present embodiment, the heat storage member 95 disposed to surround the connection portion between the electric wire 2 and the terminal 10 is accommodated in the internal space 31a of the terminal holding portion 31. In other words, the heat storage member 95 is disposed in the internal space 31a so as to reduce a gap around the connection portion between the electric wire 2 and the terminal 10.

The heat storage member 95 is made of metal. In general, when a metal member and air are compared at the same volume, a thermal capacity of the metal member is larger than a thermal capacity of air because a density of the metal is higher than a density of the air. Therefore, the thermal capacity of the heat storage member 95 made of metal is larger than the thermal capacity of air having the same volume as the heat storage member 95. That is, by accommodating the heat storage member 95 made of metal in the internal space 31a of the terminal holding portion 31, it is possible to further increase the substantial thermal capacity of the entire internal space 31a. Further, since the heat storage member 95 inside the internal space 31a, an amount of air in the internal space 31a acting as a heat insulating material can become smaller. The material constituting the heat storage member 95 is not necessarily limited to metal, and may be another material as long as the material has a thermal capacity capable of making the substantial thermal capacity of the entire internal space 31a larger than that in a case where the heat storage member 95 is not provided as described above.

As described above, since the heat generated at the connection portion between the electric wire 2 and the terminal 10 at the time of energization is absorbed by the heat storage member 95 having a large thermal capacity, it is possible to prevent a rapid increase in the temperature of the terminal 10 and to gently increase the temperature of the terminal 10 even in a case where the amount of heat generated at the connection portion per unit time is large as at the time of rapid charging.

In the present embodiment, the heat storage member 95 is deformable so as to elastically expand and contract in accordance with the shape of the internal space 31a. Further, the outer peripheral surface 95a of the heat storage member 95 is in contact with the inner surface of the housing 20 defining the internal space 31a (specifically, the inner peripheral surface of the cylindrical large diameter portion 35 of the base holder 30 and the inner peripheral surface of the tapered step portion 38), and the inner peripheral surface 95bof the heat storage member 95 is in contact with the outer surface of the connection portion between the electric wire 2 and the terminal 10 (specifically, the outer peripheral surface of the cylindrical large diameter portion 12 of the terminal 10 and the inner wall surface of the concave caulking marks 12a). That is, the heat storage member 95 fills an accommodation space by elastically expanding and contracting in the accommodation space, and thermally connects the inner surface of the housing 20 and the outer surface of the connection portion. Accordingly, the heat generated at the connection portion between the electric wire 2 and the terminal 10 when energized can be transferred to the housing 20 through the heat storage member 95. In other words, the heat storage member 95 can efficiently absorb heat from the connection portion between the electric wire 2 and the terminal 10 and radiate heat to the housing 20.

Operation and Effect

As described above, according to the connector 1 of the present embodiment, the connection portion between the electric wire 2 and the terminal 10 and the heat storage member 95 are accommodated in the internal space 31a in the housing 20. In other words, the heat storage member 95 is disposed in the internal space 31a so as to reduce a gap around the connection portion between the electric wire 2 and the terminal 10. Accordingly, the heat generated at the connection portion between the electric wire 2 and the terminal 10 at the time of energization is absorbed by the heat storage member 95 having a large thermal capacity, so that it is possible to prevent a rapid increase in the operating temperature of the terminal 10 and to gently increase the operating temperature of the terminal 10 even in a case where the amount of heat generated at the connection portion per unit time is large as at the time of rapid charging. Further, since the heat storage member 95 inside the internal space 31a, an amount of air in the internal space 31a acting as a heat insulating material can become smaller. Accordingly, the connector 1 according to the present embodiment can prevent an excessive increase in the operating temperature of the terminal 10 while avoiding an increase in the size of the connector 1.

According to the connector 1 of the present embodiment, the heat storage member 95 is deformable so as to elastically expand and contract in accordance with the shape of the internal space 31a. Further, a part (outer peripheral surface 95a) of the heat storage member 95 is in contact with the inner surface of the housing 20 defining the internal space 31a, and another part (inner peripheral surface 95b) of the heat storage member 95 is in contact with the outer surface of the connection portion between the electric wire 2 and the terminal 10. Accordingly, the heat generated at the connection portion between the electric wire 2 and the terminal 10 when energized can be transferred to the housing 20 through the heat storage member 95. In other words, the heat storage member 95 can efficiently absorb heat from the connection portion between the electric wire 2 and the terminal 10 and radiate heat to the housing 20.

Other Embodiments

The present disclosure is not limited to the embodiment described above and various modifications can be adopted within the scope of the present disclosure. For example, the present disclosure is not limited to the embodiment described above, and modifications, improvements, and the like can be made as appropriate. In addition, materials, shapes, sizes, numbers, arrangement positions and the like of components in the embodiment described above are freely selected and are not limited as long as the present disclosure can be implemented.

For example, in the embodiment described above, as the heat storage member 95, a member (that is, metal wire wool or the like) having a three-dimensional structure made of a metal wire material is adopted. On the other hand, the heat storage member 95 may be a member formed of another material or structure as long as the member is configured to be deformable so as to elastically expand and contract in accordance with the shape of the internal space 31a in which the heat storage member 95 is accommodated and has a thermal capacity capable of making the substantial thermal capacity of the entire internal space 31a larger than that in the case where the heat storage member 95 is not provided.

Here, features of the embodiment of the connector 1 according to the present disclosure described above are briefly summarized and listed as the following first to third aspects.

According to the first illustrative aspect of the present disclosure, a connector (1) includes: an electric wire (2); a terminal (10) connected to the electric wire (2); a housing (20) having an accommodation space (31a) inside the housing, the accommodation space accommodating a connection portion (12, 2a) between the electric wire (2) and the terminal (10); a seal member (93) configured to seal an opening portion of the accommodation space (31a) to isolate the connection portion (12, 2a) accommodated in the accommodation space (31a) from outside; and a heat storage member (95) disposed in the accommodation space (31a) to surround the connection portion (12, 2a). The heat storage member (95) is deformable to elastically expand and contract in accordance with a shape of the accommodation space (31a). A first part (95a) of the heat storage member (95) is in contact with an inner surface of the housing (20) defining the accommodation space (31a), and a second part (95b) of the heat storage member (95) is in contact with an outer surface of the connection portion (12, 2a).

According to the connector having the configuration of the above first aspect, the connection portion between the electric wire and the terminal and the heat storage member are accommodated in the accommodation space in the housing. In other words, the heat storage member is disposed in the accommodation space so as to reduce the gap around the connection portion. Accordingly, the heat generated at the connection portion between the electric wire and the terminal at the time of energization is absorbed by the heat storage member having a large thermal capacity, so that it is possible to prevent a rapid increase in an operating temperature of the terminal and to gently increase the operating temperature of the terminal even in a case where the amount of heat generated at the connection portion per unit time is large as at the time of rapid charging. Further, since there is the heat storage member inside the accommodation space, the amount of air in the accommodation space acting as a heat insulating material can become smaller. Accordingly, the connector according to the present configuration can prevent an excessive increase in the operating temperature of the terminal while avoiding an increase in the size of the connector.

According to the connector having the above configuration, the heat storage member is deformable so as to elastically expand and contract in accordance with a shape of the accommodation space. Further, a first part (a part) of the heat storage member is in contact with the inner surface of the housing defining the accommodation space, and a second part (another part) of the heat storage member is in contact with the outer surface of the connection portion. In other words, the heat storage member can be disposed so as to fill the accommodation space by elastically expanding and contracting in the accommodation space and to thermally connect the inner surface of the housing and the outer surface of the connection portion. Accordingly, the heat generated at the connection portion between the electric wire and the terminal at the time of energization can be transmitted to the housing through the heat storage member. In other words, the heat storage member can efficiently absorb heat from the connection portion and radiate heat to the housing.

According to the second illustrative aspect of the present disclosure, in the connector (1) of the above first aspect, the heat storage member (95) has a three-dimensional structure made of a metal wire material.

According to the connector having the configuration of the above second aspect, the heat storage member has the three-dimensional structure made of the metal wire material. Examples of the heat storage member having such a three-dimensional structure include steel wool and metal wire wool. When the heat storage member is made of a metal material having an excellent thermal conductivity, the heat storage member can absorb heat from the connection portion and radiate heat to the housing more efficiently.

According to the third illustrative aspect of the present disclosure, in the connector (1) of the above second aspect, the heat storage member (95) has a three-dimensional structure in which a plate-shaped body made of the wire material is wound to surround the connection portion (12, 2a).

According to the connector having the configuration of the above third aspect, the heat storage member is disposed so as to surround the connection portion by winding the plate-shaped body made of the metal wire material around the connection portion between the electric wire and the terminal. Accordingly, since the heat storage member (wire material) can be disposed around the connection portion at a high density, heat absorption from the connection portion and heat dissipation to the housing can be performed more efficiently.

According to the connector of the present disclosure, the connection portion between the electric wire and the terminal and the heat storage member are accommodated in the accommodation space in the housing. In other words, the heat storage member is disposed in the accommodation space so as to reduce the gap around the connection portion. Accordingly, the heat generated at the connection portion between the electric wire and the terminal at the time of energization is absorbed by the heat storage member having a large thermal capacity, so that it is possible to prevent a rapid increase in an operating temperature of the terminal and to gently increase the operating temperature of the terminal even in a case where the amount of heat generated at the connection portion per unit time is large as at the time of rapid charging. Further, since there is the heat storage member inside the accommodation space, the amount of air in the accommodation space acting as a heat insulating material can become smaller. Accordingly, the connector according to the present configuration can prevent an excessive increase in the operating temperature of the terminal while avoiding an increase in the size of the connector.

According to the connector having the above configuration, the heat storage member is deformable so as to elastically expand and contract in accordance with a shape of the accommodation space. Further, a first part (a part) of the heat storage member is in contact with the inner surface of the housing defining the accommodation space, and a second part (another part) of the heat storage member is in contact with the outer surface of the connection portion. In other words, the heat storage member can be disposed so as to fill the accommodation space by elastically expanding and contracting in the accommodation space and to thermally connect the inner surface of the housing and the outer surface of the connection portion. Accordingly, the heat generated at the connection portion between the electric wire and the terminal at the time of energization can be transmitted to the housing through the heat storage member. In other words, the heat storage member can efficiently absorb heat from the connection portion and radiate heat to the housing.

What is claimed is:

1. A connector comprising:
   an electric wire;
   a terminal;
   a connection portion connecting the terminal to the electric wire;
   a housing having an accommodation space inside the housing, the connection portion is located inside of the accommodation space;

a seal member disposed in the accommodation space and configured to seal an opening portion of the accommodation space to isolate the connection portion accommodated in the accommodation space from outside; and a heat storage member disposed in the accommodation space to surround the connection portion, wherein the heat storage member is deformable to elastically expand and contract in accordance with a shape of the accommodation space, and a first part of the heat storage member is in contact with an inner surface of the housing defining the accommodation space, and a second part of the heat storage member is in contact with an outer surface of the connection portion.

2. The connector according to claim 1, wherein the heat storage member has a three-dimensional structure made of a metal wire material.

3. The connector according to claim 2, wherein the heat storage member has a three-dimensional structure in which a plate-shaped body made of the wire material is wound to surround the connection portion.

4. The connector according to claim 1, wherein the housing includes a retainer and the seal member is located between the retainer and the heat storage member.

* * * * *